United States Patent
Lee et al.

(10) Patent No.: US 9,997,567 B1
(45) Date of Patent: Jun. 12, 2018

(54) SEMICONDUCTORS STRUCTURE HAVING AN RRAM STRUCTURE AND METHOD FOR FORMING THE SAME

(71) Applicant: MACRONIX INTERNATIONAL CO., LTD., Hsinchu (TW)

(72) Inventors: Dai-Ying Lee, Hsinchu County (TW); Chao-I Wu, Hsinchu (TW); Yu-Hsuan Lin, Taichung (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days. days.

(21) Appl. No.: 15/587,620

(22) Filed: May 5, 2017

(51) Int. Cl.
*H01L 29/02* (2006.01)
*H01L 27/24* (2006.01)
*H01L 45/00* (2006.01)

(52) U.S. Cl.
CPC ...... *H01L 27/2436* (2013.01); *H01L 45/1233* (2013.01); *H01L 45/1246* (2013.01); *H01L 45/1253* (2013.01); *H01L 45/147* (2013.01); *H01L 45/1608* (2013.01); *H01L 45/1666* (2013.01)

(58) Field of Classification Search
CPC ...................................................... H01L 29/02
USPC ........................ 257/2, E29.002; 438/102–104
See application file for complete search history.

(56) References Cited

U.S. PATENT DOCUMENTS

| | | | |
|---|---|---|---|
| 6,392,302 B1 * | 5/2002 | Hu | H01L 21/28061 257/754 |
| 7,804,083 B2 | 9/2010 | Chen | |
| 9,054,033 B2 | 6/2015 | Park | |
| 2004/0091744 A1 * | 5/2004 | Carey | B82Y 10/00 428/811.1 |
| 2006/0118841 A1 * | 6/2006 | Eliason | H01L 27/11502 257/295 |
| 2010/0051892 A1 * | 3/2010 | Mikawa | H01L 27/101 257/2 |
| 2012/0091424 A1 * | 4/2012 | Lin | H01L 45/145 257/4 |
| 2013/0292631 A1 * | 11/2013 | Chin | H01L 45/06 257/4 |
| 2015/0349127 A1 * | 12/2015 | Kurata | H01L 27/1225 257/43 |

FOREIGN PATENT DOCUMENTS

| | | |
|---|---|---|
| TW | 200924184 | 6/2009 |
| TW | 201508963 A | 3/2015 |

OTHER PUBLICATIONS

TIPO Office Action dated Jul. 13, 2017 in Taiwan (application No. 106114836).

* cited by examiner

*Primary Examiner* — Jami M Valentine
(74) *Attorney, Agent, or Firm* — McClure, Qualey & Rodack, LLP

(57) ABSTRACT

A semiconductor structure includes a memory structure. The memory structure includes a memory element, a first barrier layer and a second barrier layer. The memory element includes titanium oxynitride. The first barrier layer includes at least one of silicon and silicon oxide. The first barrier layer is disposed on the memory element. The second barrier layer includes at least one of titanium and titanium oxide. The second barrier layer is disposed on the first barrier layer.

20 Claims, 15 Drawing Sheets

US 9,997,567 B1

SEMICONDUCTORS STRUCTURE HAVING AN RRAM STRUCTURE AND METHOD FOR FORMING THE SAME

TECHNICAL FIELD

This disclosure relates to a semiconductor structure and a method for forming the same. More particularly, this disclosure relates to a semiconductor structure comprising a memory structure and a method for forming the same.

BACKGROUND

Resistive random access memory (RRAM) is a type of nonvolatile memory that provides the benefits of simple structure, small cell size, scalability, ultrafast operation, low-power operation, CMOS compatibility, low cost and so on. A RRAM comprises a memory element that may have a resistance changeable between two or more stable resistance ranges by applying an electrical pulse. A RRAM may further comprise components like top electrode, bottom electrode and so on. The materials used to form the memory element and other components of a RRAM may be chosen and adjusted. By this manner, a larger sensing window, a longer retention time, a better endurance and/or other improved aspects of performance may be achieved.

SUMMARY

This disclosure relates to improvements for memory devices, particularly to improvements for a RRAM.

According to some embodiments, a semiconductor structure is provided. The semiconductor structure comprises a memory structure. The memory structure comprises a memory element, a first barrier layer and a second barrier layer. The memory element comprises titanium oxynitride. The first barrier layer comprises at least one of silicon and silicon oxide. The first barrier layer is disposed on the memory element. The second barrier layer comprises at least one of titanium and titanium oxide. The second barrier layer is disposed on the first barrier layer.

According to some embodiments, a method for forming a semiconductor structure is provided. The method comprises forming a memory structure, which comprises following steps. A memory element is formed. The memory element comprises titanium oxynitride. A first barrier layer is formed on the memory element. The first barrier layer comprises at least one of silicon and silicon oxide. A second barrier layer is formed on the first barrier layer. The second barrier layer comprises at least one of titanium and titanium oxide.

Figure 1:
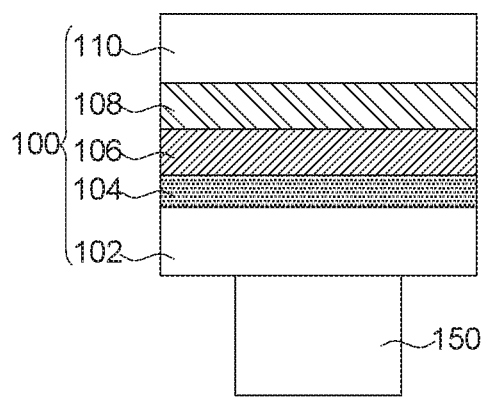
FIG. 1 illustrates an exemplary semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. To facilitate understanding, identical reference numerals have been used, where possible, to designate identical elements that are common to the figures. It is contemplated that elements and features of one embodiment may be beneficially incorporated in another embodiment without further recitation.

Referring to FIG. 1, an exemplary semiconductor structure according to embodiments is shown. The semiconductor structure comprises a memory structure 100. While not limited thereto, the memory structure 100 is illustrated as a RRAM structure here. The memory structure 100 comprises a memory element 104, a first barrier layer 106 and a second barrier layer 108. The memory element 104 comprises titanium oxynitride ($TiO_xN_y$). The first barrier layer 106 comprises at least one of silicon and silicon oxide ($SiO_x$). The first barrier layer 106 is disposed on the memory element 104. The second barrier layer 108 comprises at least one of titanium and titanium oxide ($TiO_x$). The second barrier layer 108 is disposed on the first barrier layer 106.

Specifically, while not limited thereto, the entire memory element 104 may be formed of titanium oxynitride, which has a programmable resistance for the RRAM application. The first barrier layer 106 may be formed of silicon. Alternatively, the first barrier layer 106 may be formed of silicon oxide. The arrangement of the silicon or silicon oxide barrier layer is beneficial for improving the retention of a $TiO_xN_y$-included memory structure. The second barrier layer 108 may be formed of titanium. Alternatively, the second barrier layer 108 may be formed of titanium oxide. The arrangement of the titanium or titanium oxide barrier layer is beneficial for improving the endurance of a $TiO_xN_y$-included memory structure and enlarging the sensing window thereof.

The memory structure 100 may further comprise a top electrode 110. The top electrode 110 may comprise titanium nitride ($TiN_x$), such as entirely be formed of titanium nitride. The top electrode 110 is disposed on the second barrier layer 108. The memory structure 100 may further comprise a bottom electrode 102. The bottom electrode 102 may comprise titanium nitride, such as entirely be formed of titanium nitride. The memory element 104 is disposed on the bottom electrode 102.

Figure 3A:
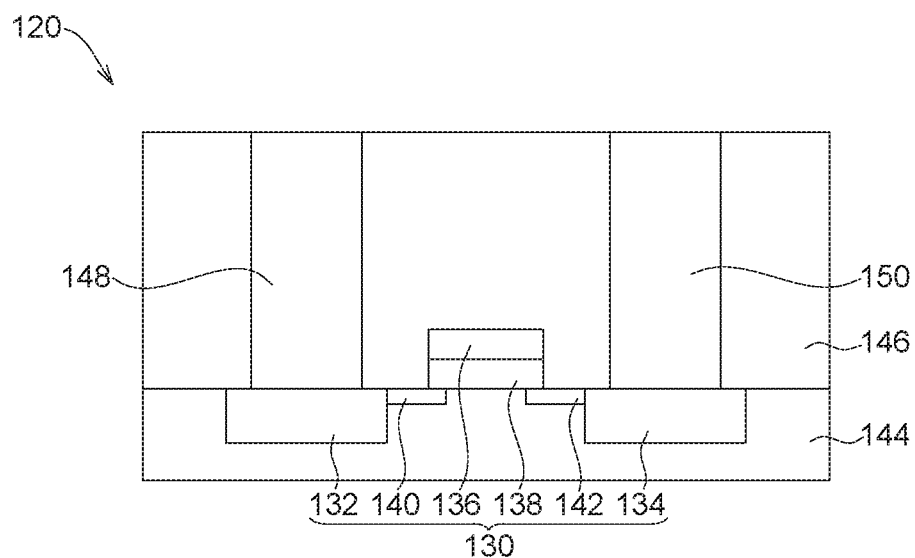
FIGS. 3A-3H illustrates an exemplary method for forming a semiconductor structure according to embodiments.

As shown in FIG. 1, the semiconductor structure may further comprise a conductive connector 150, such as a contact or a via. The conductive connector 150 can be used for coupling the memory structure 100 to a corresponding access device, such as the transistor 130 as shown in FIG. 3A or a diode. The bottom electrode 102 is disposed on the conductive connector 150.

Figure 2:
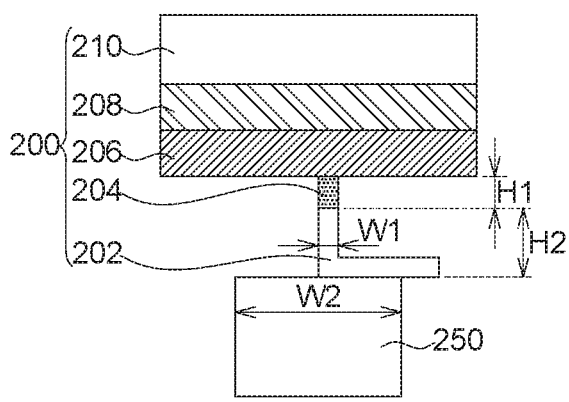
FIG. 2 illustrates another exemplary semiconductor structure according to embodiments.

Referring to FIG. 2, another exemplary semiconductor structure according to embodiments is shown. The semiconductor structure comprises a memory structure 200. The memory structure 200 comprises a memory element 204, a first barrier layer 206 and a second barrier layer 208. The memory element 204 comprises titanium oxynitride. The first barrier layer 206 comprises at least one of silicon and silicon oxide. The first barrier layer 206 is disposed on the memory element 204. The second barrier layer 208 comprises at least one of titanium and titanium oxide. The second barrier layer 208 is disposed on the first barrier layer 206. The memory structure 200 may further comprise a top electrode 210. The memory structure 200 may further comprise a bottom electrode 202. The semiconductor structure may further comprise a conductive connector 250. The first barrier layer 206, the second barrier layer 208, the top electrode 210 and the conductive connector 250 may be similar to the corresponding components shown in FIG. 1. The semiconductor structure shown in FIG. 2 differs from the semiconductor structure shown in FIG. 1 in that the semiconductor structure shown in FIG. 2 comprises a sidewall-type bottom electrode 202 and thereby a smaller memory element 204. Details of which are described in the following paragraph.

The bottom electrode 202 has a L-shape. In some embodiments, the bottom electrode 202 has a first width W1, the conductive connector 250, on which the bottom electrode 202 disposed, has a second width W2, and W1/W2<½. For example, the first width W1 may be 10 Å to 200 Å. The second width W2 may be 1000 Å to 5000 Å. The memory element 204 disposed on the bottom electrode 202 may also have the first width W1. Compared to the memory element 104, the memory element 204 can have a smaller size, and thereby be beneficial for the scaling of the memory devices like RRAM devices. In some embodiments, the memory element 204 has a first height H1, the bottom electrode 202 has a second height H2, and H1/H2≤1/10.

Now the description is directed to a method for forming a semiconductor structure according to embodiments. Referring to FIGS. 3A-3H, an exemplary forming method is illustrated. FIGS. 3A-3H are illustrated to form a semiconductor structure as shown in FIG. 1.

The method comprises forming a memory structure 100. Before the formation of the memory structure 100, a preliminary structure 120 may be provided, such that the memory structure 100 can be formed thereon. Specifically, as shown in FIG. 3A, such a preliminary structure 120 may comprise a conductive connector 150, wherein the memory structure 100 will be formed on the conductive connector 150.

In some embodiments, as shown in FIG. 3A, the preliminary structure 120 comprises a transistor 130 as the access device for the memory structure 100. The transistor 130 may comprise two opposite heavily-doped regions 132 and 134 as well as a gate electrode 136 and a gate dielectric 138 disposed between the heavily-doped regions 132 and 134. The transistor 130 may further comprise two lightly-doped regions 140 and 142 corresponding to the heavily-doped regions 132 and 134, respectively. In some embodiments, the heavily-doped regions 132 and 134 and the lightly-doped regions 140 and 142 may be n-type doped regions. The gate electrode 136 may be formed of polysilicon. The gate dielectric 138 may be formed of oxide. The heavily-doped regions 132 and 134 and the lightly-doped regions 140 and 142 may be disposed in a substrate 144, such as a silicon substrate, of the preliminary structure 120. The gate electrode 136 and the gate dielectric 138 are disposed on the substrate 144, and the gate electrode 136 is disposed on the gate dielectric 138. A dielectric layer 146 of the preliminary structure 120 may be disposed on the substrate 144 and cover the gate electrode 136 and the gate dielectric 138. The preliminary structure 120 may comprise two conductive connectors 148 and 150. The conductive connectors 148 and 150 penetrate through the dielectric layer 146 and are connected to two terminals of the access device. In this method, said two terminals are the heavily-doped regions 132 and 134.

In some other embodiments, instead of the transistor 130, the preliminary structure 120 comprises a diode (not shown) or other suitable devices as the access device for the memory structure 100.

Figure 3B:
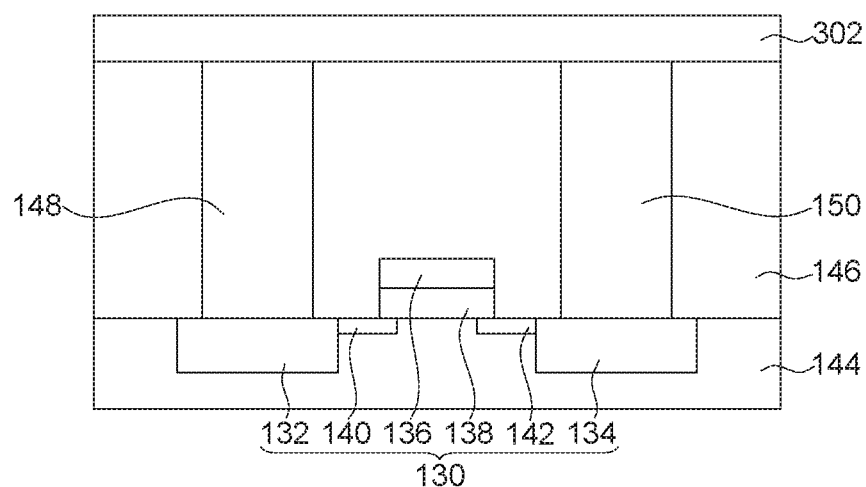

Then, the memory structure 100 is formed. First, as shown in FIG. 3B, a bottom electrode material 302 may be formed on the preliminary structure 120 as shown in FIG. 3A. The bottom electrode material 302 may be, but not limited to, titanium nitride.

Figure 3C:
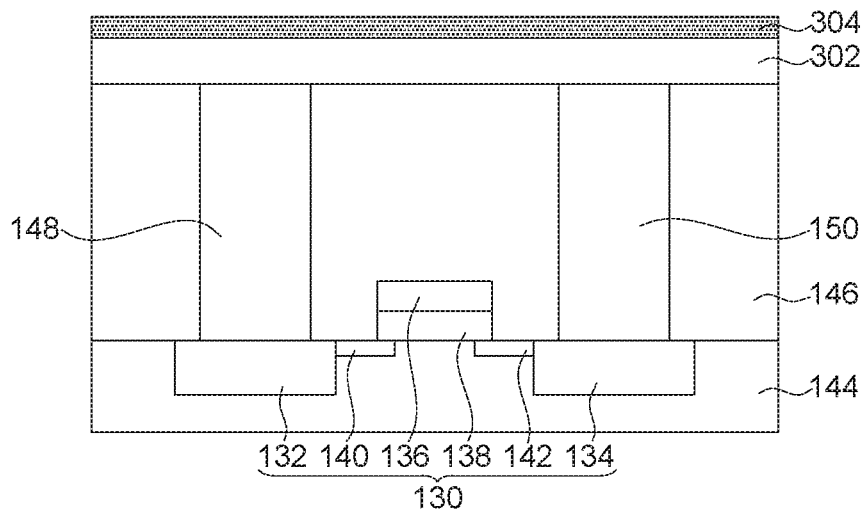

As shown in FIG. 3C, a memory element material 304 is formed, such as on the bottom electrode material 302. The memory element material 304 comprises titanium oxynitride. However, in some embodiments, other suitable materials may be used to form one or more additional layers of a memory element. In the cases that the bottom electrode material 302 is titanium nitride and the memory element material 304 is titanium oxynitride, the memory element material 304 may be formed by oxidizing the bottom electrode material 302. The oxidization process can be an $O_2$ plasma process, an $O_2$ treatment process, an $O_3$ treatment process or the like.

Figure 3D:
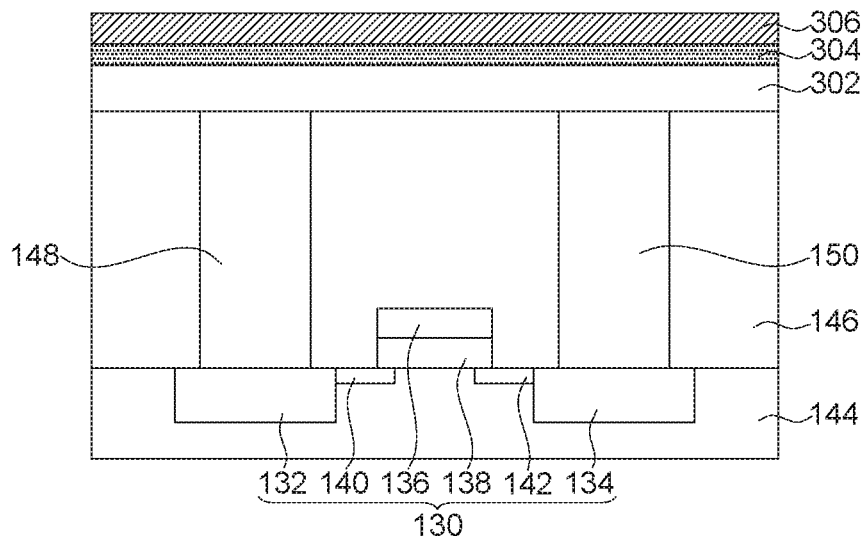

As shown in FIG. 3D, a first barrier material 306 is formed on the memory element material 304. The first barrier material 306 comprises at least one of silicon and silicon oxide. For example, the first barrier material 306 may be silicon or silicon oxide. The first barrier material 306 being silicon may be formed by a deposition process. The first barrier material 306 being silicon oxide may be formed by depositing a silicon layer and oxidizing the silicon layer.

Figure 3E:
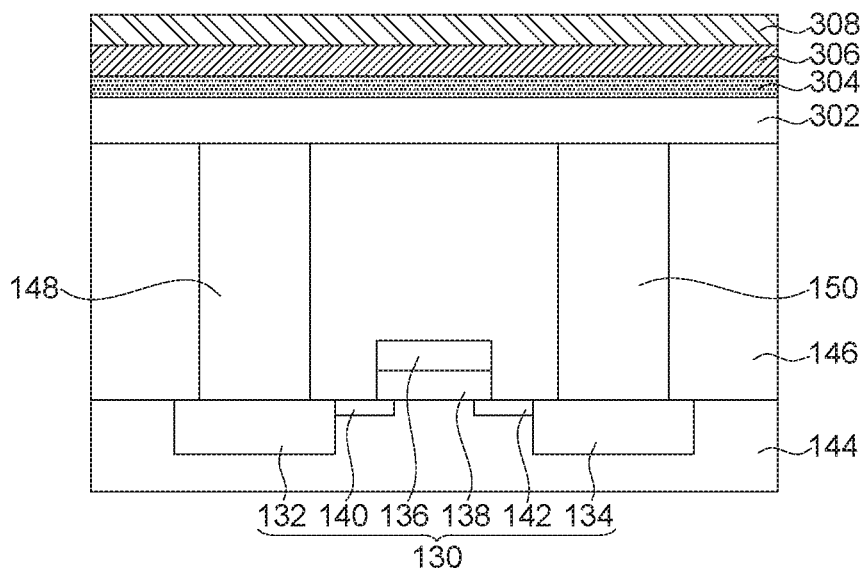

As shown in FIG. 3E, a second barrier material 308 is formed on the first barrier material 306. The second barrier material 308 comprises at least one of titanium and titanium oxide. For example, the second barrier material 308 may be titanium or titanium oxide. The second barrier material 308 being titanium may be formed by a deposition process. The second barrier material 308 being titanium oxide may be formed by depositing a titanium layer and oxidizing the titanium layer.

Figure 3F:
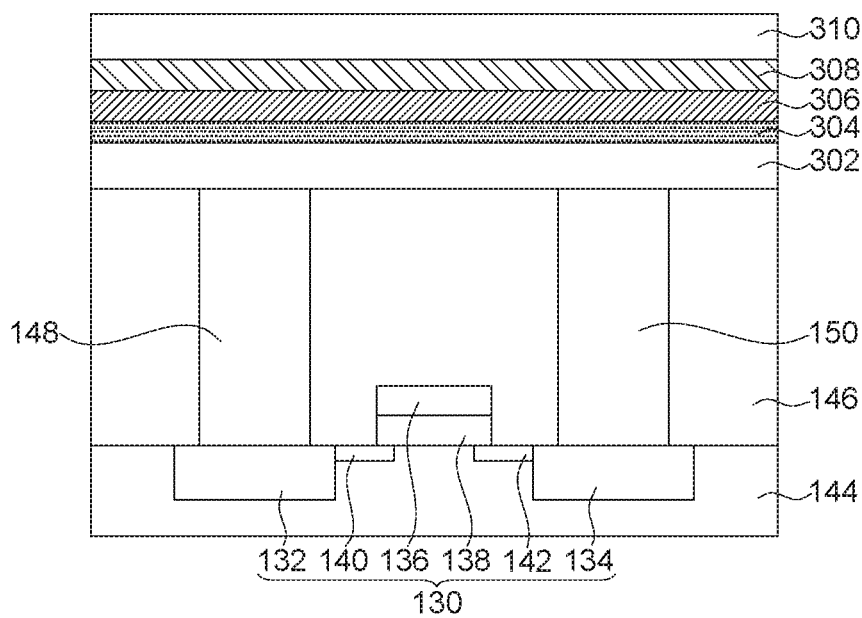

As shown in FIG. 3F, a top electrode material 310 may be formed on the second barrier material 308. The top electrode material 310 may be, but not limited to, titanium nitride. The top electrode material 310 may be formed by a deposition process.

Figure 3G:
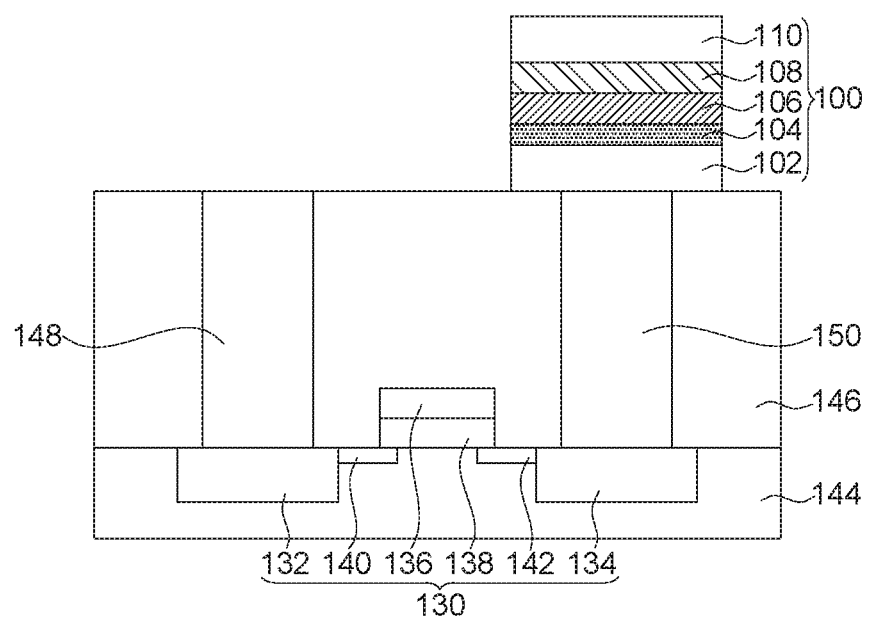

Then, as shown in FIG. 3G, a patterning process may be performed to remove the redundant top electrode material 310, second barrier material 308, first barrier material 306, memory element material 304 and bottom electrode material 302, and thereby the memory structure 100 is formed. In some other embodiments, the materials for the memory structure 100 may be sequentially formed in only the desired area, and thus a patterning process is unneeded.

Figure 3H:
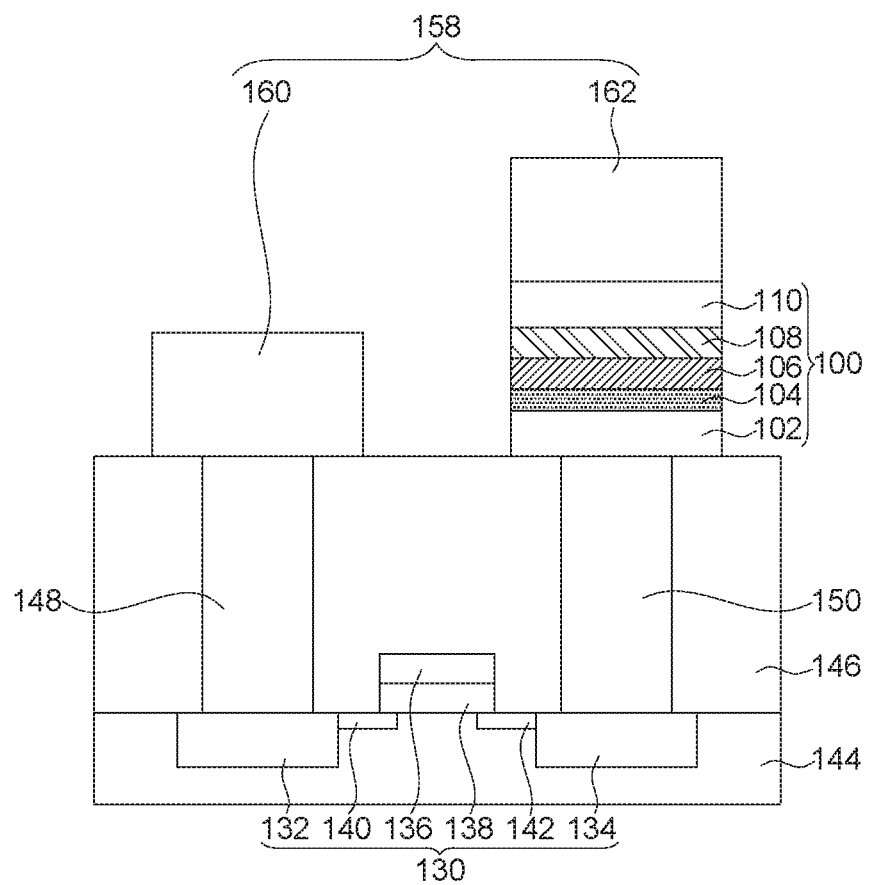

After the formation of the memory structure 100, as shown in FIG. 3H, a metal layer 158 may be formed. The metal layer 158 may comprise a portion 160 disposed on and coupled to the conductive connector 148 and a portion 162 disposed on and coupled to the memory structure 100. The metal layer 158 may be formed by a deposition process and an etching process. According to some embodiments, conventional BEOL processes may be performed thereafter.

Referring to FIGS. 4A-4M, another exemplary method for forming a semiconductor structure according to embodiments is illustrated. FIGS. 4A-4M are illustrated to form a semiconductor structure as shown in FIG. 2.

The method comprises forming a memory structure 200. Before the formation of the memory structure 200, a preliminary structure 220 may be provided, such that the memory structure 200 can be formed thereon. Specifically, as shown in FIG. 4A, such a preliminary structure 220 may comprise a conductive connector 250, wherein the memory structure 200 will be formed on the conductive connector 250.

Figure 4A:
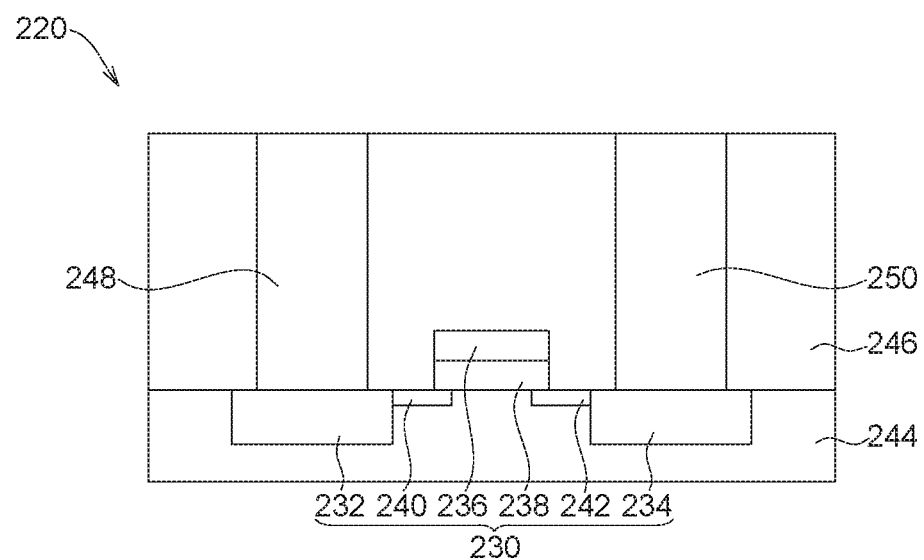
FIGS. 4A-4M illustrates another exemplary method for forming a semiconductor structure according to embodiments.

In some embodiments, as shown in FIG. 4A, the preliminary structure 220 comprises a transistor 230 as the access device for the memory structure 200. The transistor 230 may comprise two opposite heavily-doped regions 232 and 234 as well as a gate electrode 236 and a gate dielectric 238 disposed between the heavily-doped regions 232 and 234. The transistor 230 may further comprise two lightly-doped regions 240 and 242 corresponding to the heavily-doped regions 232 and 234, respectively. In some embodiments, the heavily-doped regions 232 and 234 and the lightly-doped regions 240 and 242 may be n-type doped regions. The gate electrode 236 may be formed of polysilicon. The gate dielectric 238 may be formed of oxide. The heavily-doped regions 232 and 234 and the lightly-doped regions 240 and 242 may be disposed in a substrate 244, such as a silicon substrate, of the preliminary structure 220. The gate electrode 236 and the gate dielectric 238 are disposed on the substrate 244, and the gate electrode 236 is disposed on the gate dielectric 238. A dielectric layer 246 of the preliminary structure 220 may be disposed on the substrate 244 and cover the gate electrode 236 and the gate dielectric 238. The preliminary structure 220 may comprise two conductive connectors 248 and 250. The conductive connectors 248 and 250 penetrate through the dielectric layer 246 and are connected to two terminals of the access device. In this method, said two terminals are the heavily-doped regions 232 and 234.

In some other embodiments, instead of the transistor 230, the preliminary structure 220 comprises a diode (not shown) or other suitable devices as the access device for the memory structure 200.

Figure 4B:
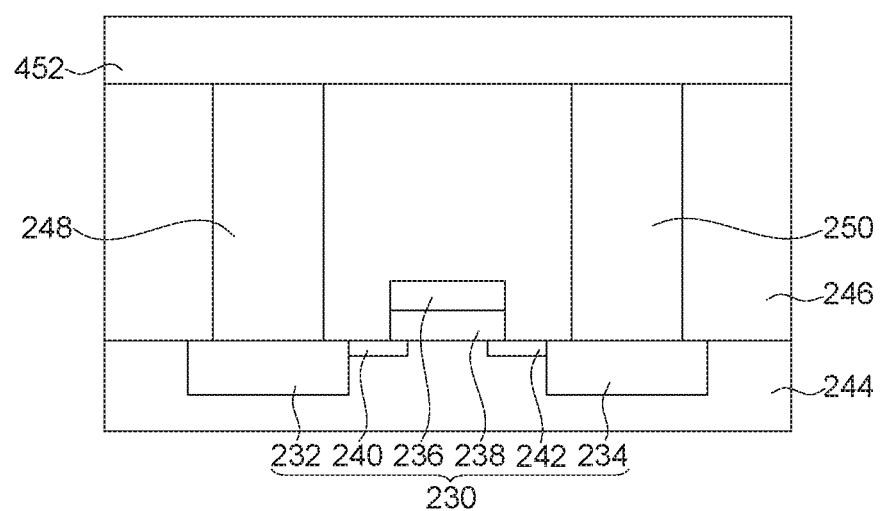

Then, the memory structure 200 is formed. First, a bottom electrode 202 may be formed. As shown in FIG. 4B, a first insulating material 452 may be formed on the preliminary structure 220 as shown in FIG. 4A. The first insulating material 452 may be, but not limited to, silicon nitride ($SiN_x$). The first insulating material 452 may be formed by a deposition process. The first insulating material 452 may have a thickness of 1000 Å to 2000 Å, such as 1500 Å.

Figure 4C:
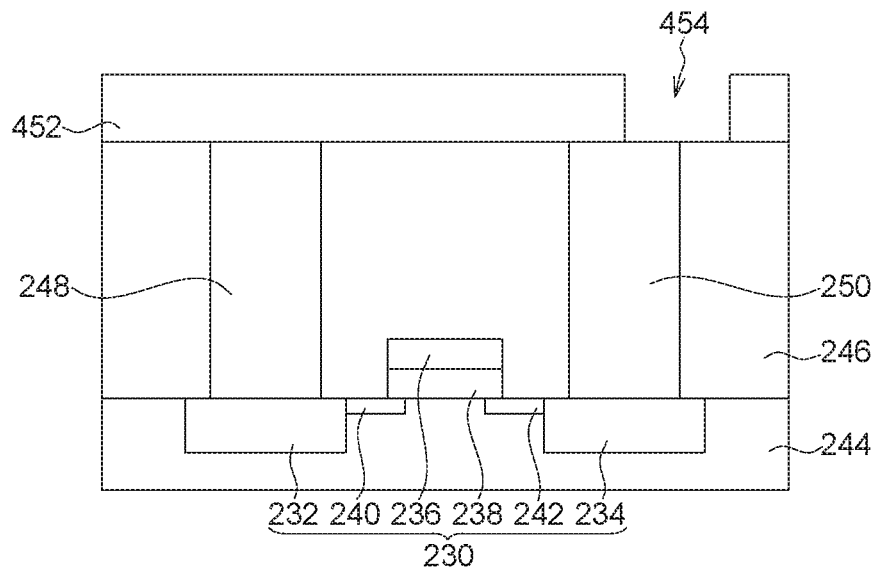

As shown in FIG. 4C, an opening 454 is formed in the first insulating material 452. A portion of the conductive connector 250, on which the memory structure 200 will be formed, is exposed by the opening 454. For example, in some embodiments, about a half of the top surface area of the conductive connector 250 is exposed by the opening 454. In some embodiments, the opening 454 may be formed as a trench.

Figure 4D:
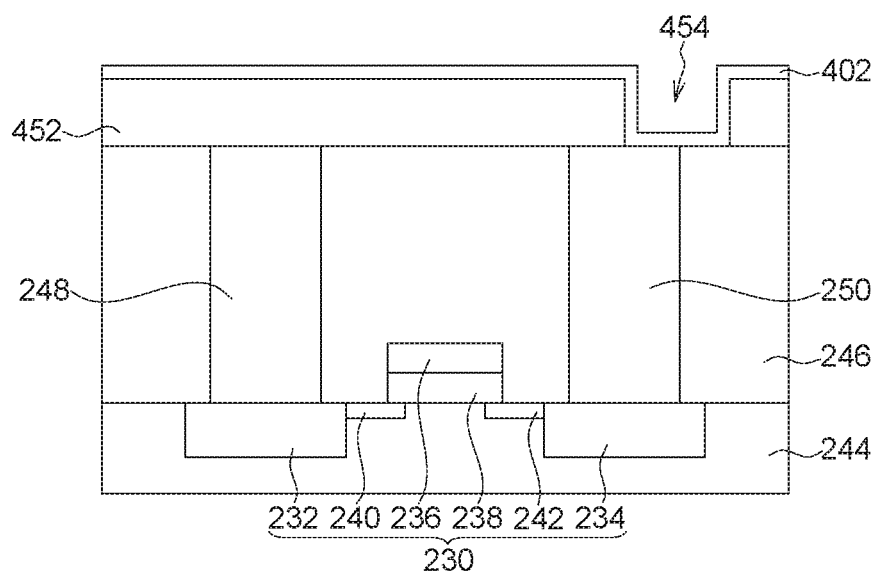
Figure 4E:
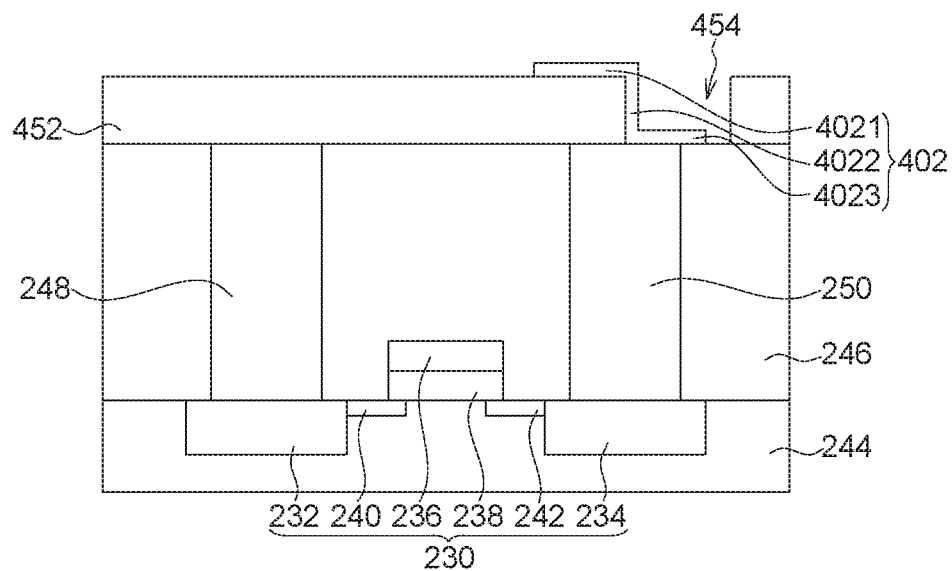

As shown in FIG. 4D, a bottom electrode material 402 may be conformally formed on the first insulating material 452 having the opening 454. The bottom electrode material 402 may be, but not limited to, titanium nitride. The bottom electrode material 402 may be formed by a deposition process, such as a chemical vapor deposition (CVD) process or a physical vapor deposition (PVD) process. The bottom electrode material 402 may have a thickness of 50 Å to 200 Å, such as 100 Å. The thickness of the bottom electrode material 402 and thereby the first width W1 of the bottom electrode 202 can be controlled by the deposition process. Then, as shown in FIG. 4E, the bottom electrode material 402 is patterned such that a remaining portion of the bottom electrode material 402 has a Z-shape comprising a portion 4021 on the first insulating material 452, a portion 4022 on a sidewall of the opening 454 and a portion 4023 on a bottom of the opening 454.

Figure 4F:
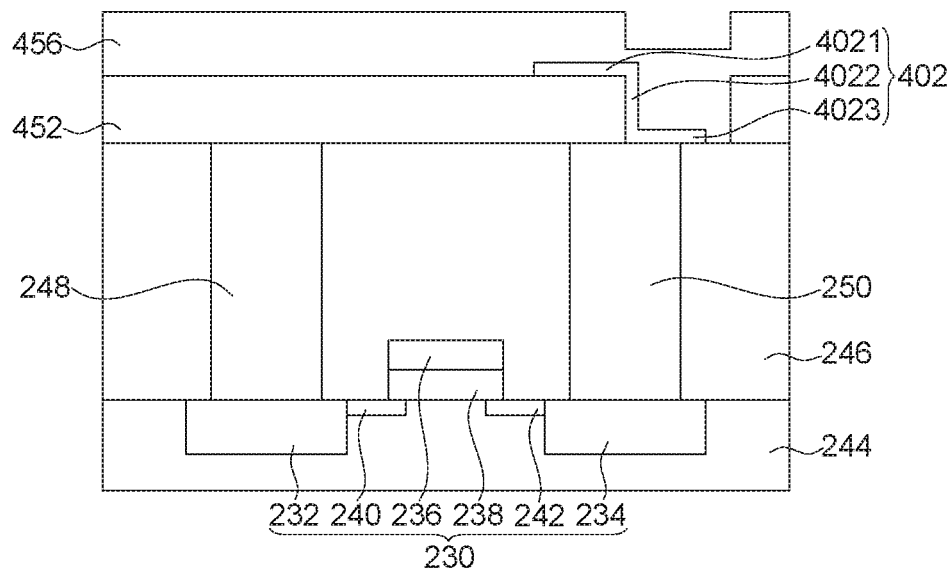

As shown in FIG. 4F, a second insulating material 456 may be formed on the first insulating material 452 and the remaining portion of the bottom electrode material 402. The second insulating material 456 fills into the opening 454. The second insulating material 456 may be, but not limited to, oxide. For example, both the first insulating material 452 and the second insulating material 456 may be silicon nitride, oxide or other suitable insulating materials. The second insulating material 456 may be formed by a deposition process, such as a deposition process during which TEOS is used.

Figure 4G:
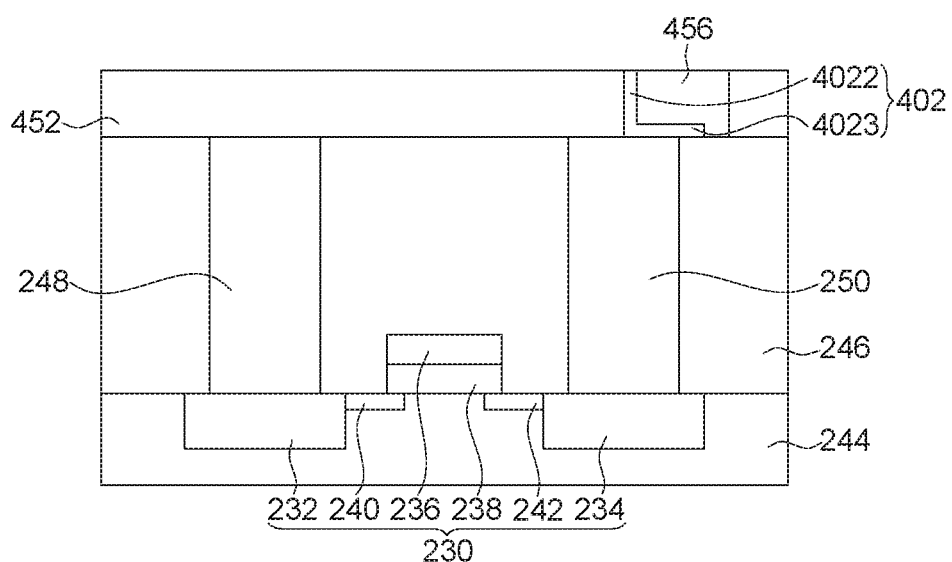

As shown in FIG. 4G, a planarization process may be performed such that the second insulating material 456 on the first insulating material 452 and the portion 4021 of said (Z-shape) remaining portion of the bottom electrode material 402 that is on the first insulating material 452 are removed. As such, a top surface of the bottom electrode material 402 is exposed. The planarization process may be a chemical mechanical planarization (CMP) process.

Figure 4H:
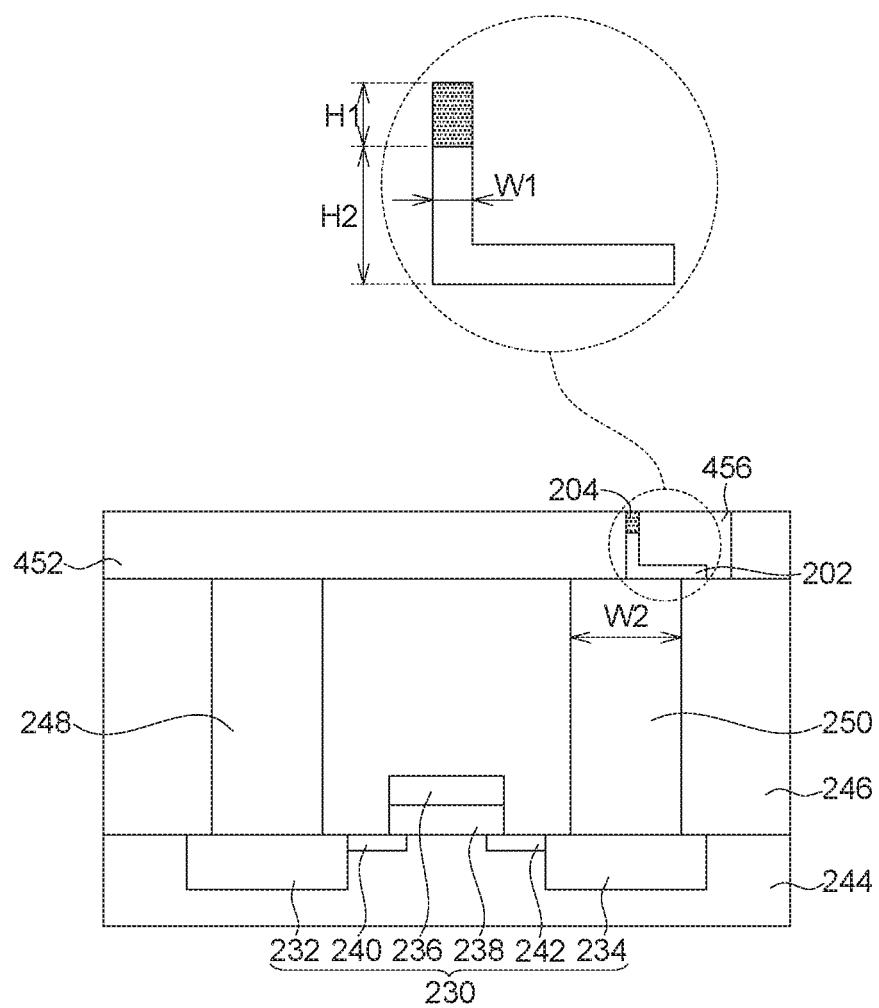

Then, as shown in FIG. 4H, a memory element 204 is formed. The memory element 204 comprises titanium oxynitride. In the cases that the bottom electrode material 402 is titanium nitride and the memory element 204 is formed of titanium oxynitride, the memory element 204 may be formed by oxidizing the bottom electrode material 402. The oxidization process can be an $O_2$ plasma process, an $O_2$ treatment process, an $O_3$ treatment process or the like.

The remaining portion of the bottom electrode material 402 is used as the bottom electrode 202. In some embodiments, the bottom electrode 202 has a first width W1, the conductive connector 250, on which the bottom electrode 202 disposed, has a second width W2, and W1/W2<½. For example, the first width W1 may be 10 Å to 200 Å. The second width W2 may be 1000 Å to 5000 Å. Since the memory element 204 is formed by oxidizing the bottom electrode material 402, the memory element 204 may also have the first width W1. In some embodiments, the memory element 204 has a first height H1, the bottom electrode 202 has a second height H2, and H1/H2≤⅒. The first height H1 can be controlled by adjusting conditions during the oxidation process. The sum of the first height H1 and the second height H2 may equal to the thickness of the first insulating material 452, which may be 1000 Å to 2000 Å, such as 1500 Å.

Figure 4I:
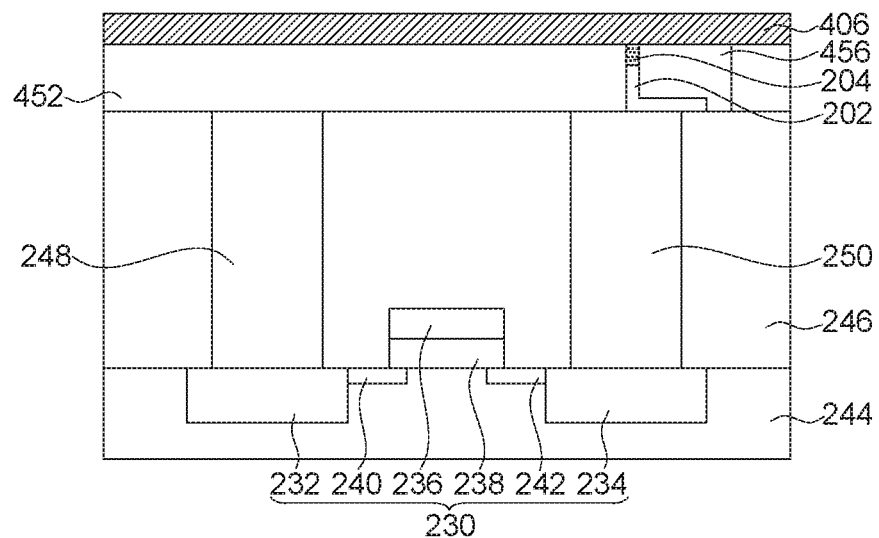

As shown in FIG. 4I, a first barrier material 406 is formed on the memory element 204. The first barrier material 406 comprises at least one of silicon and silicon oxide. For example, the first barrier material 406 may be silicon or silicon oxide. The first barrier material 406 being silicon may be formed by a deposition process. The first barrier material 406 being silicon oxide may be formed by depositing a silicon layer and oxidizing the silicon layer. The first barrier material 406 may have a thickness of 5 Å to 50 Å, such as 10 Å.

Figure 4J:
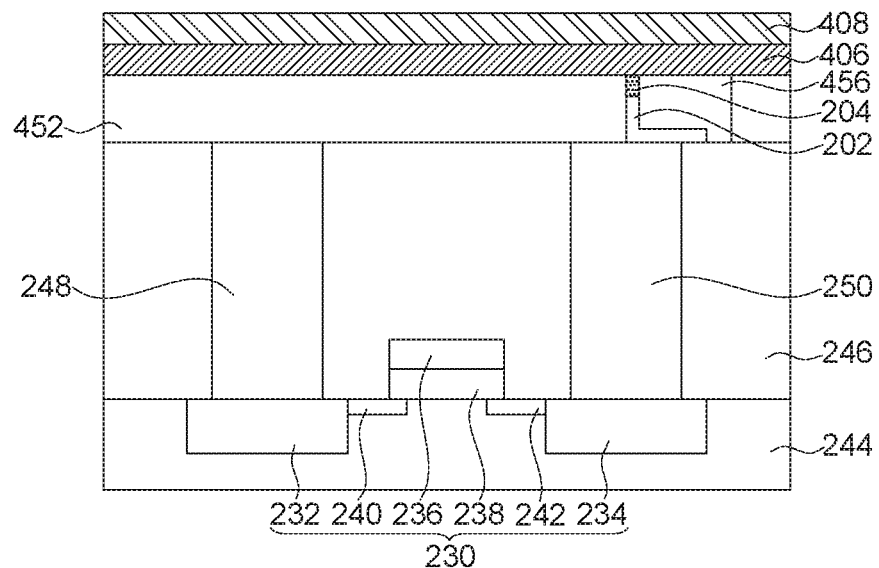

As shown in FIG. 4J, a second barrier material 408 is formed on the first barrier material 406. The second barrier material 408 comprises at least one of titanium and titanium oxide. For example, the second barrier material 408 may be titanium or titanium oxide. The second barrier material 408 being titanium may be formed by a deposition process. The second barrier material 408 being titanium oxide may be formed by depositing a titanium layer and oxidizing the titanium layer. The second barrier material 408 may have a thickness of 5 Å to 50 Å, such as 10 Å.

Figure 4K:
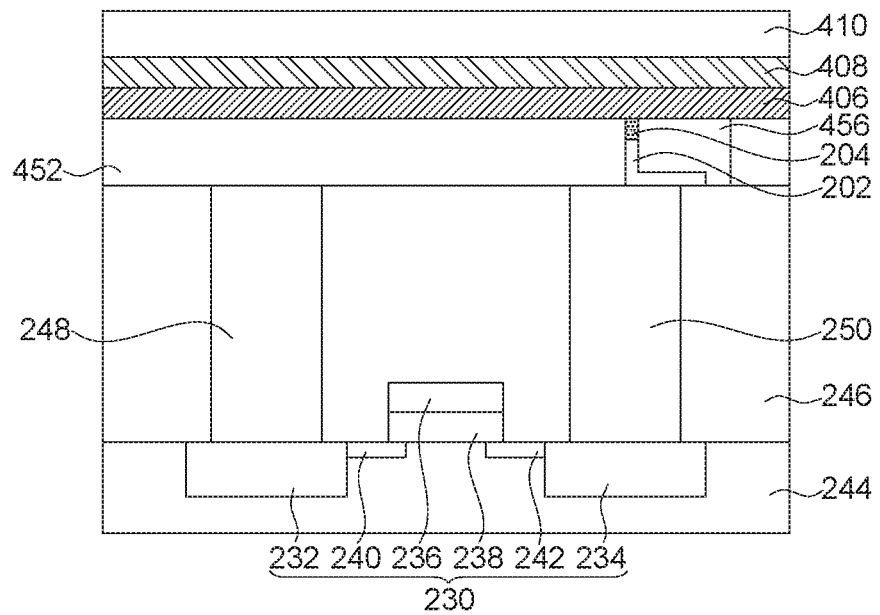

As shown in FIG. 4K, a top electrode material 410 may be formed on the second barrier material 408. The top electrode material 410 may be, but not limited to, titanium nitride. The top electrode material 410 may be formed by a deposition process. The top electrode material 410 may have a thickness of 50 Å to 500 Å, such as 400 Å.

Figure 4L:
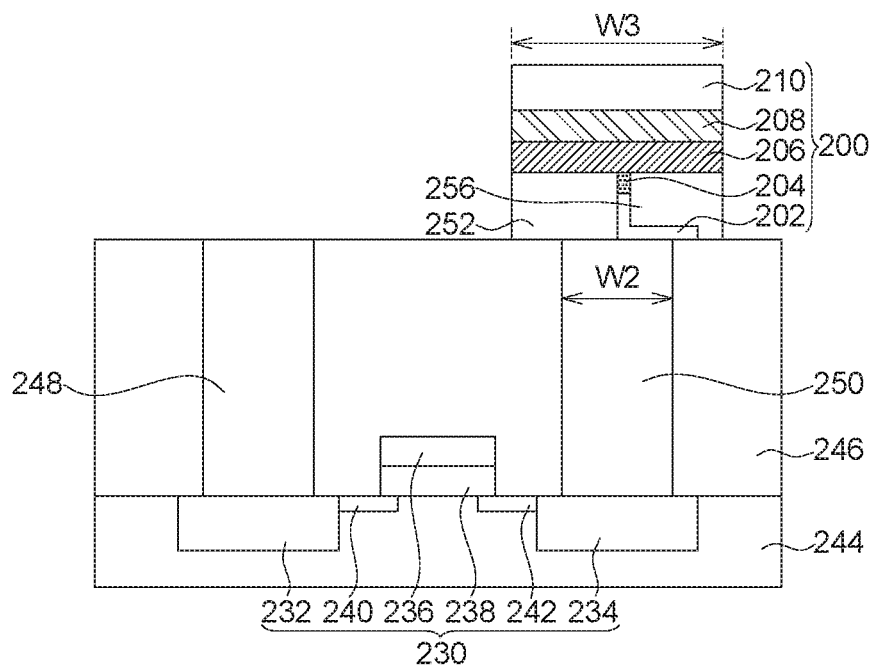

As shown in FIG. 4L, a patterning process may be performed to remove the redundant top electrode material 410, second barrier material 408 and first barrier material 406 and thereby the memory structure 200 is formed. In some other embodiments, these materials may be sequentially formed in only the desired area, and thus a patterning process is unneeded. In this exemplary forming method, other than the bottom electrode 202 and the memory element 204, a remaining portion 252 of the first insulating material 452 and a remaining portion 256 of the second insulating material 456 are also disposed between the conductive connector 250 and the first barrier layer 206. The memory structure 200 may have a third width W3, and W3>W2. For example, the second width W2 may be about 0.3 μm, and the third width W3 may be about 0.5 μm.

Figure 4M:
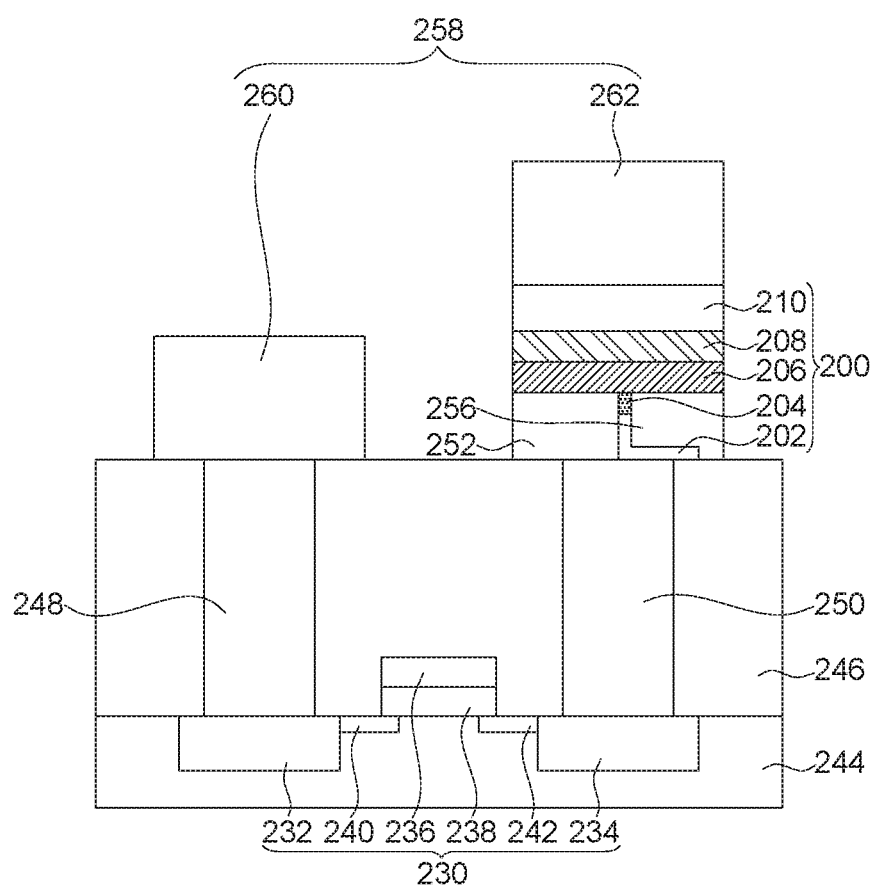

After the formation of the memory structure 200, as shown in FIG. 4M, a metal layer 258 may be formed. The metal layer 258 may comprise a portion 260 disposed on and coupled to the conductive connector 248 and a portion 262 disposed on and coupled to the memory structure 200. The metal layer 258 may be formed by a deposition process and an etching process. According to some embodiments, conventional BEOL processes may be performed thereafter.

Figure 5A:
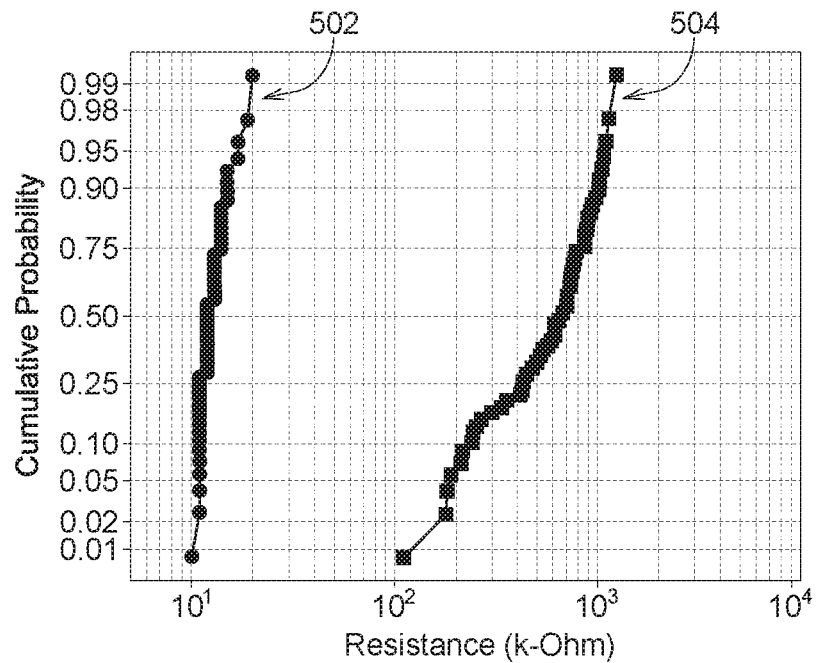
FIGS. 5A-5B shows electrical features of a semiconductor structure according to embodiments.

The semiconductor structure according to embodiments provides better performances of memory devices, and particularly better performances of a RRAM. FIG. 5A shows electrical features of a semiconductor structure according to embodiments, wherein the line 502 corresponds to the SET state, and the line 504 corresponds to the RESET state. As shown in FIG. 5A, the semiconductor structure provides a higher RESET resistance and a lower SET resistance. As such, a large sensing window (>10 times) between the SET state and the RESET state is obtained. In addition, the memory structure, such as a RRAM device, of the semiconductor structure can be operated in a wide current range. This is beneficial for applying an optimized operation current to improve the data retention time.

Figure 5B:
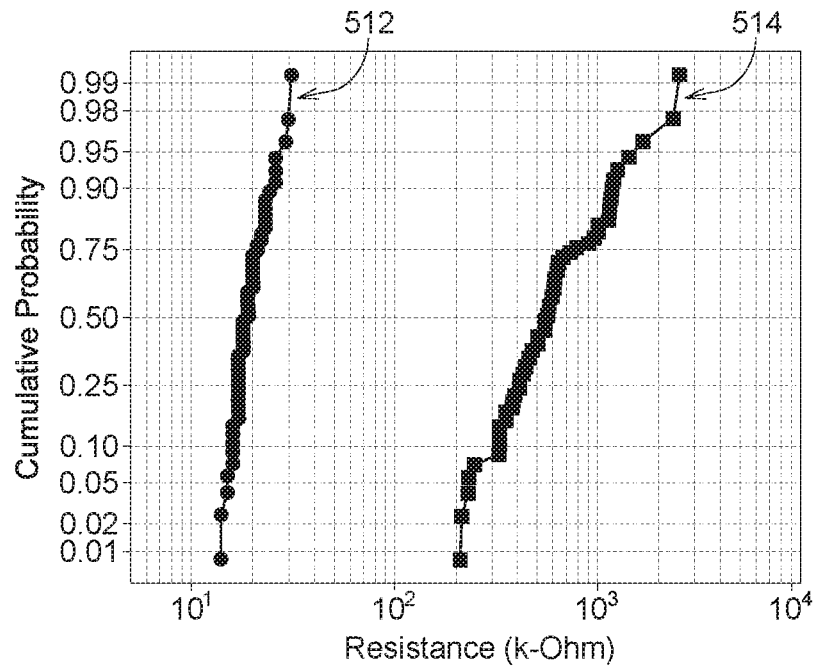

FIG. 5B shows electrical features of a semiconductor structure according to embodiments after a retention test carried out at 250° C. for 3 days, wherein the line 512 corresponds to the SET state, and the line 514 corresponds to the RESET state. As shown in FIG. 5B, after the retention test, the semiconductor structure still has a large sensing window. The semiconductor structure shows a good reliability.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
a memory structure, comprising:
a memory element comprising titanium oxynitride;
a first barrier layer comprising at least one of silicon and silicon oxide, the first barrier layer disposed on the memory element;
a second barrier layer comprising at least one of titanium and titanium oxide, the second barrier layer disposed on the first barrier layer;
wherein the memory element, the first barrier layer and the second barrier layer are sequentially disposed.

2. The semiconductor structure according to claim 1, wherein the memory structure further comprises a top electrode, and the top electrode is disposed on the second barrier layer.

3. The semiconductor structure according to claim 1, wherein the memory structure further comprises a bottom electrode, and the memory element is disposed on the bottom electrode.

4. The semiconductor structure according to claim 3, wherein the bottom electrode has a L-shape.

5. The semiconductor structure according to claim 3, further comprising:
a conductive connector, wherein the bottom electrode is disposed on the conductive connector.

6. The semiconductor structure according to claim 5, wherein the bottom electrode has a first width W1, the conductive connector has a second width W2, and W1/W2<½.

7. The semiconductor structure according to claim 6, wherein the first width W1 is 10 Å to 200 Å.

8. The semiconductor structure according to claim 6, wherein the second width W2 is 1000 Å to 5000 Å.

9. The semiconductor structure according to claim 3, wherein the memory element has a first height H1, the bottom electrode has a second height H2, and H1/H2≤⅒.

10. A method for forming a semiconductor structure, comprising:
forming a memory structure, comprising:
forming a memory element, the memory element comprising titanium oxynitride;
forming a first barrier layer on the memory element, the first barrier layer comprising at least one of silicon and silicon oxide; and
forming a second barrier layer on the first barrier layer, the second barrier layer comprising at least one of titanium and titanium oxide;
wherein the memory element, the first barrier layer and the second barrier layer are sequentially formed.

11. The method according to claim 10, wherein forming the memory structure further comprises:
forming a top electrode on the second barrier layer.

12. The method according to claim 11, wherein forming the first barrier layer, the second barrier layer and the top electrode comprising:
sequentially forming a first barrier material, a second barrier material and a top electrode material on the memory element; and
performing a patterning process.

13. The method according to claim 10, wherein forming the memory structure further comprises:
before forming the memory element, forming a bottom electrode, wherein the memory element is formed on the bottom electrode.

14. The method according to claim 13, wherein forming the memory element comprises oxidizing a bottom electrode material.

15. The method according to claim 13, wherein forming the bottom electrode comprises:
forming a first insulating material;
forming an opening in the first insulating material;
conformally forming a bottom electrode material on the first insulating material having the opening;
patterning the bottom electrode material such that a remaining portion of the bottom electrode material has a Z-shape comprising a portion on the first insulating material, a portion on a sidewall of the opening and a portion on a bottom of the opening;

forming a second insulating material on the first insulating material and the remaining portion of the bottom electrode material, the second insulating material filling into the opening; and performing a planarization process such that the second insulating material on the first insulating material, and the portion of the remaining portion of the bottom electrode material that is on the first insulating material are removed.

16. The method according to claim 13, further comprising:

before forming the memory structure, providing a preliminary structure comprising a conductive connector, wherein the memory structure is formed on the conductive connector.

17. The method according to claim 16, wherein the bottom electrode has a first width W1, the conductive connector has a second width W2, and $W1/W2 < 1/2$.

18. The method according to claim 17, wherein the first width W1 is 10 Å to 200 Å.

19. The method according to claim 17, wherein the second width W2 is 1000 Å to 5000 Å.

20. The method according to claim 13, wherein the memory element has a first height H1, the bottom electrode has a second height H2, and $H1/H2 \leq 1/10$.

* * * * *